(12) United States Patent
Schneider et al.

(10) Patent No.: US 7,746,257 B2
(45) Date of Patent: Jun. 29, 2010

(54) DELTA-SIGMA ANALOG-TO-DIGITAL CONVERTER CIRCUIT HAVING REDUCED SAMPLED REFERENCE NOISE

(75) Inventors: Edmund M. Schneider, Austin, TX (US); Eric J. Swanson, Buda, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 25 days.

(21) Appl. No.: 12/366,214

(22) Filed: Feb. 5, 2009

(65) Prior Publication Data
US 2009/0278720 A1 Nov. 12, 2009

Related U.S. Application Data

(60) Provisional application No. 61/051,148, filed on May 7, 2008.

(51) Int. Cl.
*H03M 3/00* (2006.01)
(52) U.S. Cl. ...................................................... 341/143
(58) Field of Classification Search .......... 341/143–155
See application file for complete search history.

(56) References Cited

U.S. PATENT DOCUMENTS

| | | | |
|---|---|---|---|
| 4,227,185 A | 10/1980 | Kronlage | |
| 4,495,591 A | 1/1985 | Loomis, Jr. | |
| 4,599,573 A | 7/1986 | Senderowicz | |
| 4,887,085 A | 12/1989 | Moyal | |
| 4,896,155 A | 1/1990 | Craiglow | |
| 4,940,981 A | 7/1990 | Naylor et al. | |
| 4,972,189 A | 11/1990 | Polito et al. | |
| 4,972,436 A | 11/1990 | Halim et al. | |
| 4,999,632 A | 3/1991 | Parks | |
| 5,010,347 A | 4/1991 | Yukawa | |
| 5,012,178 A | 4/1991 | Weiss et al. | |
| 5,068,659 A | 11/1991 | Sakaguchi | |
| 5,079,550 A | 1/1992 | Sooch et al. | |
| 5,084,702 A | 1/1992 | Ribner | |
| 5,101,206 A | 3/1992 | Riedel | |
| 5,159,341 A * | 10/1992 | McCartney et al. | ......... 341/143 |
| 5,162,801 A | 11/1992 | Powell et al. | |
| 5,257,026 A | 10/1993 | Thompson et al. | |
| 5,274,375 A | 12/1993 | Thompson | |

(Continued)

OTHER PUBLICATIONS

Yang, et al., "On-Line Adaptive Digital Correction of Dual-Quantisation Delta-Sigma Modulators", IET Electronics Letters, vol. 28, No. 16, pp. 1511-1513, Jul. 30, 1992, UK.

(Continued)

*Primary Examiner*—Lam T Mai
(74) *Attorney, Agent, or Firm*—Andrew M. Harris; Mitch Harris, Atty at Law, LLC

(57) ABSTRACT

A delta-sigma analog-to-digital converter (ADC) circuit improves performance by reducing the amount of noise and other error sampled by the reference switching circuit. The reference switching network is operated intermittently only when the charge on an input integrator exceeds a threshold, thereby preventing the input integrator from saturating, while avoiding needlessly injecting reference noise. The input to the ADC may be a current injected directly into a summing node of the integrator, or may be a voltage supplied through another switching network.

20 Claims, 4 Drawing Sheets

U.S. PATENT DOCUMENTS

| | | | |
|---|---|---|---|
| 5,351,050 | A | 9/1994 | Thompson et al. |
| 5,528,239 | A | 6/1996 | Swanson et al. |
| 5,621,406 | A | 4/1997 | Goetzinger et al. |
| 6,061,009 | A * | 5/2000 | Krone et al. ............... 341/143 |
| 6,064,326 | A * | 5/2000 | Krone et al. ............... 341/143 |
| 6,157,331 | A | 12/2000 | Liu et al. |
| 6,975,103 | B1 * | 12/2005 | Blom ..................... 324/99 D |
| 7,129,875 | B1 * | 10/2006 | Altun et al. ............... 341/143 |
| 7,352,166 | B1 * | 4/2008 | Blom ..................... 324/99 D |

OTHER PUBLICATIONS

CS5542 Datasheet, Cirrus Logic, Sep. 1996, US.

CS5394 Datasheet, Cirrus Logic, May 1998, US.

Paulos et al, "Improved Signal-to-Noise Ratio Using Tri-Level Delta-Sigma Modulation", IEEE Proc. ISCAS, May 1987, p. 463-466.

Adams et al, "Design and Implementation of an Audio 18-Bit Analog-to-Digital Converter Using Oversampling Techniques", Audio Eng. Soc., vol. 34, p. 156-266, Mar. 1986.

Hauser et al., "Circuit and Technology Considerations for MOS Delta-Sigma A/D Converters", IEEE Proc. ISCAS 86, p. 1310-1315, May 1986.

Larson et al., "Multibit Oversampled .SIGMA.-.DELTA. A/D Converter with Digital Error Correction", Electron. Lett., vol. 24, p. 1041-1052, Aug. 1998.

Carley, "A Noise-Shaping Coder Topology for 15+ Bit Converters", IEEE J. Solid-State Circuits, vol. SC-24, p. 267-273, Apr. 1989.

Abdennadher, et al., "Adaptive Self calibrating Delta-Sigma Modulators", Electronics Letters, Jul. 2, 1992, vol. 28, No. 14.

Yang et al., "On-Line Adaptive Digital Correction of Dual-Quantisation Delta-Sigma Modulators", Electronics Letters, Jul. 30, 1992, vol. 28, No. 16.

\* cited by examiner

DELTA-SIGMA ANALOG-TO-DIGITAL CONVERTER CIRCUIT HAVING REDUCED SAMPLED REFERENCE NOISE

The present U.S. patent application claims priority under 35 U.S.C. §119(e) to U.S. Provisional Patent Application Ser. No. 61/051,148, filed on May 7, 2008.

BACKGROUND OF THE INVENTION

1. Field of the Invention

The present invention relates generally to analog-to-digital converters, and more specifically, to a delta-sigma analog-to-digital converter having reduced sampled reference noise.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

A delta-sigma modulator is constructed around an integrating circuit that integrates an input signal, and which is maintained in a stable operating range by application of a reference input, which provides a charge that cancels, on average, the charge applied by the input signal to the integrator. In switched-capacitor implementations of the ADC reference circuit, the reference charge is applied by a switched-capacitor network. A predominant source of noise in switched-capacitor delta-sigma ADCs is thermal noise sampled from the reference voltage. While a reference voltage can be made very low noise, the instantaneous thermal noise (and any other instantaneous error, such as high-frequency noise) present on the reference voltage is "captured" by the sampling switching network at the end of the reference sampling period, when the reference charge is captured on the reference sampling capacitor. Therefore, a full range of reference noise values (including peak noise values) can and will be present in the reference as applied to the ADC integrator.

The equivalent current noise due to switched capacitor sampling is governed by the following proportionality:

$$i_{eq}^2 \alpha 4kTCf_S \Delta f,$$

where $i_{eq}$ is the equivalent input current due to the switched-capacitor sampling, k is Boltzmann's constant, T is the absolute temperature, C is the capacitance of the sampling capacitor, $f_S$ is the sampling frequency, and $\Delta f$ is the bandwidth of interest. Because $i_{eq}^2$ depends on k, T and C, the sampled reference thermal noise is sometimes referred to as kTC noise. The impact of the above-described reference thermal noise sampling is that the overall reference noise level is directly proportional to the rate of switching of the reference. As the sampling frequency is increased, the amount of signal input current increases, but the amount of applied reference thermal noise also increases. Therefore, the frequency of reference sampling should be minimized. However, the sampling frequency cannot be lowered arbitrarily, as in order to cancel the input signal, and thereby avoid saturating the integrator, a minimum reference switching rate is dictated by the input signal level, assuming a constant reference level.

Therefore, it would be desirable to provide a delta-sigma ADC that has a reduced amount of reference thermal noise and in general, reduces the error captured from the reference voltage.

SUMMARY OF THE INVENTION

The present invention includes an analog-to-digital converter (ADC) and its method of operation. The ADC has a reduced reference switching frequency, and therefore reduced reference noise and error injection.

The ADC has a switched capacitor reference that is operated only when a signal indicates that a charge on an input signal integrator has exceeded a threshold. By intermittently operating the reference switching circuit, the amount of noise injected by the switching circuit that injects the reference charge is reduced. The input signal may be a current injected directly into the integrator summing node(s) or a voltage that is converted to charge quanta provided through another switched-capacitor network. An output processing circuit quantizes the output of the integrator, differentiates it and combines it with information about whether reference charge was applied, in order to convert the input signal to a digital value.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus in the form of a delta-sigma type analog-to-digital converter in which the impact of reference thermal noise is reduced by applying the reference only when necessary to prevent the input integrator from exceeding a threshold, thereby preventing non-linear operation of the integrator, while not requiring reference sampling at the sampling clock rate.

Figure 1:
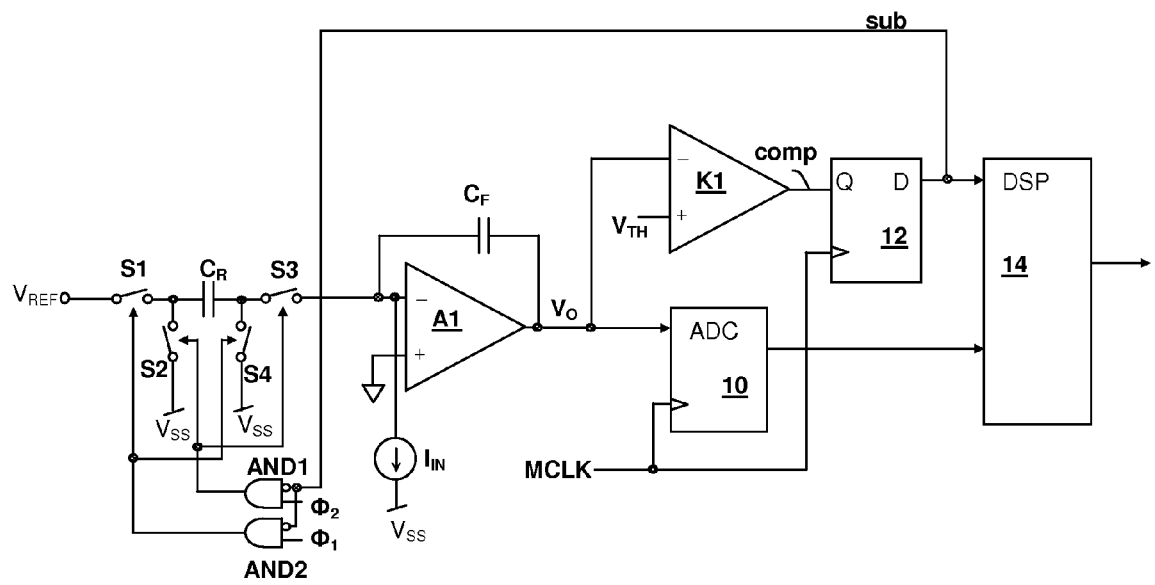
FIG. 1 is a block diagram depicting an ADC in accordance with an embodiment of the present invention.

Referring now to FIG. 1, an ADC converter circuit in accordance with an embodiment of the present invention is shown. An integrator, implemented by amplifier A1 and feedback capacitor $C_F$, integrates an input current $I_{IN}$ provided at the summing node of the integrator at the inverting input of amplifier A1. In order to prevent the integrator from saturating, or behaving non-linearly as integrator output voltage $V_O$ approaches a power supply rail of amplifier A1, charge must be removed from feedback capacitor $C_F$, at least periodically. In a traditional switched-capacitor delta-sigma ADC circuit, the charge is removed at each period according to the sampling rate, by applying reference charge quanta at the periodic clocking rate of the modulator. In the present invention, logical-AND gates AND1 and AND2 gate clock phases Φ1 and Φ2, so that a switching network formed by switches S1-S4 is only activated occasionally, in time to prevent amplifier A1 from operating non-linearly, but providing a minimum of reference thermal noise.

A comparator K1 detects when integrator output voltage $V_O$ exceeds a threshold voltage $V_{TH}$ to generate a detector output signal comp. Detector output signal comp is sampled by a latch 12 to generate a control signal sub, that suppresses switching of the switching network formed by switches S1-S4, except for a number of sampling periods of sampling clock MCLK for which output voltage $V_O$ exceeds a threshold voltage $V_{TH}$ at the beginning of the sampling periods. The switching network formed by switches S1-S4 applies a reference voltage $V_{REF}$ across a reference capacitor $C_R$ to generate a reference charge quanta during clock phase Φ1, which is "dumped" onto feedback capacitor $C_F$ at clock phase Φ2, causing integrator A1 to integrate input current $I_{IN}$. Therefore, integrator output voltage $V_O$ represents the integral of input current $I_{IN}$, less a number of reference quanta $V_{REF}*C_i/C_f$, where $C_i$ and $C_f$ are the capacitances of capacitors $C_I$ and $C_F$, respectively.

The resulting operation of the ADC depicted in FIG. 1 injects reference noise at a lower rate than that of typical delta-sigma ADCs, and therefore produces a lower total noise value as mentioned above for input current $I_{IN}$ values less than a maximum input current level $I_{MAX}$ (i.e., the input current level at which integrator output voltage $V_O$ will reach threshold voltage $V_{TH}$ during each period of sampling clock MCLK). Due to the relationship between the rate at which reference quanta are applied through reference capacitor $C_R$ and the level of input current $I_{IN}$, the illustrated ADC has a signal-to-noise ratio that "tracks" the input current level $I_{IN}$, rather than a signal-to-noise ratio for a typical delta-sigma ADC, which is generally specified only with respect to a maximum signal level. The average rate at which the reference quanta are applied is equal to the rate required to exactly remove the charge supplied by the input signal, and therefore represents an optimum reference switching rate. The size of reference capacitor $C_R$ and the voltage of voltage reference $V_{REF}$ are chosen in the depicted embodiment such that a single cycle of sampling clock MCLK is sufficient to discharge feedback capacitor $C_F$ such that a charge corresponding to $V_{TH}*C_f$ is applied by the reference switching circuit during a single period of sampling clock MCLK. Depending on the value of input current $I_{IN}$ during the sampling period the reduction may be less than $V_{TH}$, but the resulting operation ensures that integrator output $V_O$ will not grow without bound.

In order to provide a signal measurement value as a digital output of the delta-sigma ADC circuit of FIG. 1, a multi-bit ADC 10 samples integrator output voltage $V_O$, according to sample clock MCLK, in a manner similar to that of an ordinary ADC circuit. However, the quantized output value provided from ADC 10 is not fed-back as a reference value into the integrator formed by amplifier A1 and capacitor $C_F$, and the output of ADC 10 does not exactly represent input current $I_{IN}$. The value provided from ADC 10 is used to compute a digital representation of input current $I_{IN}$, which in conjunction with an accumulated value of the sub signal, which indicates the difference between integral of input current $I_{IN}$ and the output of ADC 12. In the ADC circuit of FIG. 1, the computation of the final ADC output value is performed by a digital signal processor (DSP) 14, but dedicated logic can also be used to generate the output value, which is computed according to:

$$\int I_{IN} = N*V_{REF}*C_R/C_F + M,$$

where M is the output value of ADC 12 and N is the number of previous MCLK periods during which control signal sub was asserted. Therefore, to obtain the average value of input current $I_{IN}$ over a sampling interval, DSP 14 computes:

$$I[n] = \text{sub}*V_{REF}*C_R/C_F + M[n] - M[n-1],$$

where sub represents a unit step according to whether control signal sub is asserted for sample n. While the differentiation expressed above is a first order finite difference, it is understood that higher-order polynomials can be used to obtain the derivative of the output of the integrator to improve the accuracy of the converter, and may or may not be suitable in a given application and for a given relationship between the maximum reference switching rate and the rate of sampling clock MCLK.

A multi-bit internal ADC is not a requirement of the present invention, and is shown in the illustrative embodiment as only one example of an ADC that can perform a measurement of the output of the integrator. Another ADC that will provide suitable performance is a one-bit oversampling delta-sigma modulator (DSM) based ADC of a traditional type that performs noise-shaping of the ADC output value. For example a single-bit third order DSM may be used in place of a multi-bit ADC for implementing internal ADC 12. However, the post-modulator filter will generally have a multi-bit output.

The converter of FIG. 1 can also be viewed as a multi-stage noise-shaping (MASH) converter, in which an output of the integrator as obtained by ADC 12 is combined with the single bit sub signal to yield the output value. In either analysis, the converter of the present invention yields a reduction of reference noise and a signal-to-noise ratio with respect to reference noise that tracks the input signal level so that the signal-to-reference-noise ratio remains essentially constant, no matter what signal level is used to specify the ratio.

Figure 2:
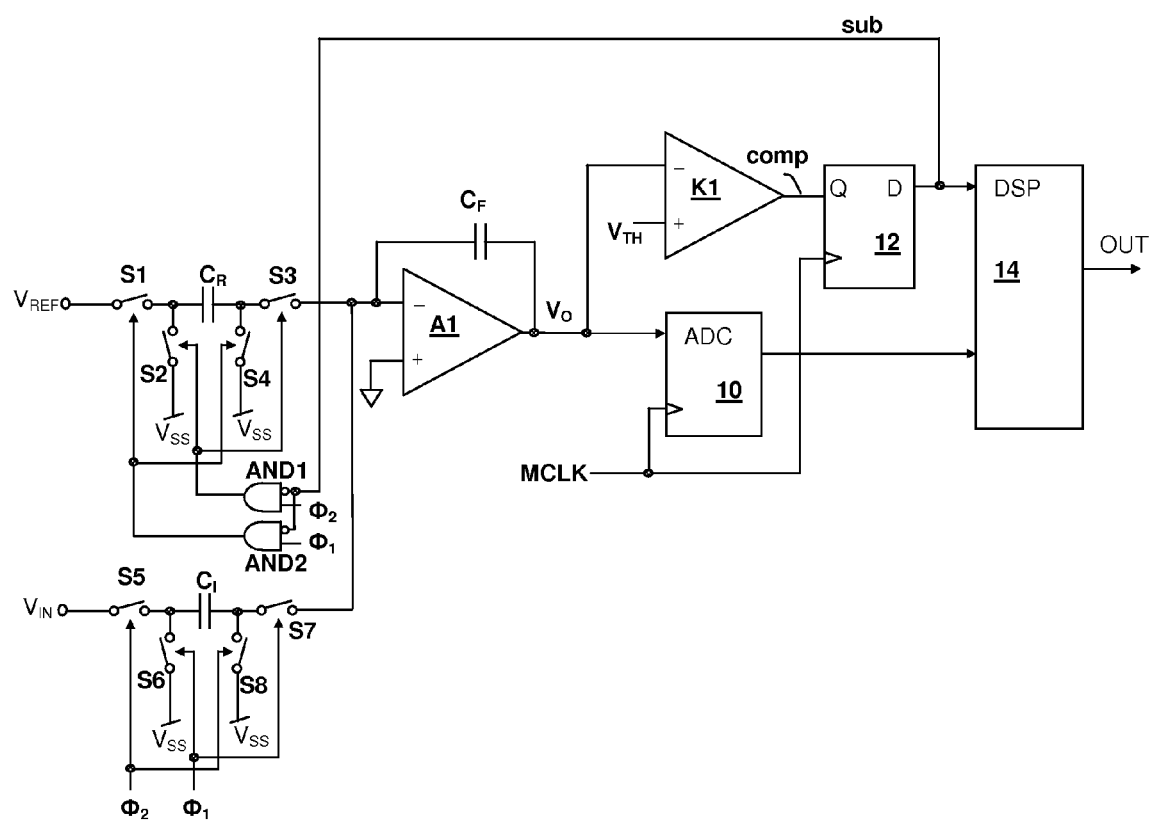
FIG. 2 is a block diagram depicting another ADC in accordance with another embodiment of the present invention.

Referring now to FIG. 2, an ADC circuit in accordance with another embodiment of the present invention is shown. The ADC circuit of FIG. 2 is similar to the ADC circuit of FIG. 1, and therefore only differences between them will be described below. The ADC of FIG. 2 receives an input voltage $V_{IN}$ instead of an input current signal, and therefore, a second switching network formed by switches S5-S8 is used to apply input voltage $V_{IN}$ via input sampling capacitor $C_I$ to the summing node of the integrator formed by amplifier A1 and feedback capacitor $C_F$. Unlike the reference switching network formed by switches S1-S4, the switching network formed by switches S5-S8 is not interrupted by the action of the threshold detection circuit formed by comparator K1, but rather operates continuously, applying a charge quanta of $V_{IN}*C_i/C_{if}$ at each period of sampling clock MCLK. Reference switching network is operated intermittently, as in the circuit of FIG. 1, only when integrator output voltage $V_O$ exceeds threshold voltage $V_{TH}$.

The reference signal-to-noise ratio improvement in the ADC circuit of FIG. 2 is the same as for the ADC circuit of FIG. 1. However, since the switched-capacitor input sampling process also produces thermal noise, input sampling switching noise is present due to the switching network formed by switches S5-S8. If the input sampling switching noise is equal to the reference sampling noise, a maximum improvement of 6 dB in the signal-to-noise ratio would be expected for the ADC circuit of FIG. 2 (assuming zero thermal noise in amplifier A1, etc.), whereas the signal-to-noise ratio improvement for the ADC circuit of FIG. 1 is potentially much greater for low input signal levels.

Figure 3:
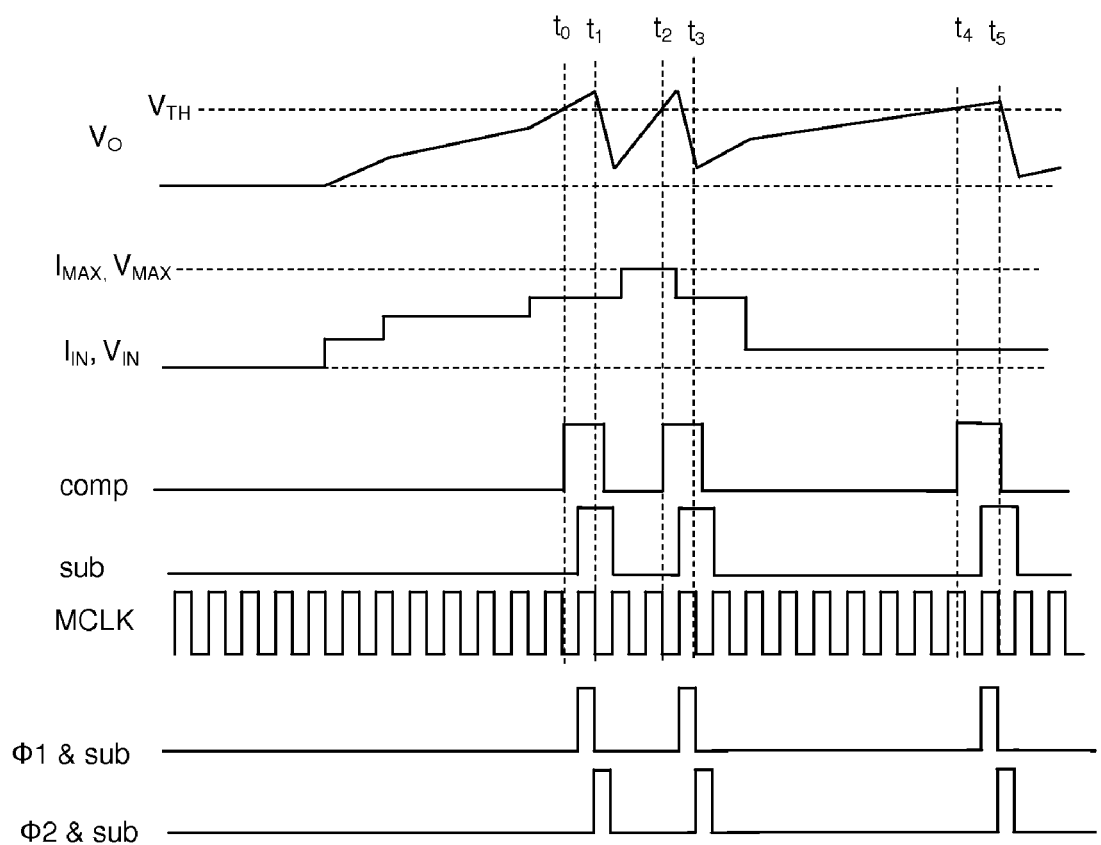
FIG. 3 is a signal waveform diagram depicting signal relationships within the circuits of FIG. 1 and FIG. 2.

Referring now to FIG. 3, an exemplary set of signals within the circuits of FIG. 1 and FIG. 2 are shown in time and voltage or current relationship with each other, to further demonstrate the operation of the depicted embodiment. Integrator output voltage $V_O$ represents the integral of input current $I_{IN}$ (or input voltage $V_{IN}$), except that at times $t_1$, $t_3$ and $t_5$, a fixed amount of charge has been removed from the integrator in order to maintain the output of the integrator within a linear operating range. Input current $I_{IN}$ or input voltage $V_{IN}$ is illustrated as a signal having discrete steps for clarity of illustration of the integral operation, but the actual input signal may have a continuously varying value. The charge is removed in response to signal sub, which as illustrated in FIG. 1 and FIG. 2 above, gates the switching clock to provide clock phases Φ1 and Φ2 to the reference switching network as described above as gated clock phases Φ1 & sub and Φ2 & sub. In FIG. 3, the switching clock is depicted as the sampling clock MCLK, although such is not a requirement of the present invention, as the switching clock may be provided at a lower frequency, reducing noise while reducing the dynamic range of input signal $I_{IN}$ that can be handled by the integrator, or at a higher frequency, which increases reference noise to some degree.

At times $t_0$, $t_2$ and $t_4$, comparator K1 has detected that integrator output voltage $V_O$ has exceeded threshold voltage $V_{TH}$ and asserts detector output signal comp, which is then latched on the rising edge of sampling clock MCLK to generate signal sub. Signal sub is thereby asserted at times $t_1$, $t_3$ and $t_5$ for a single clock period, and the consequent reference thermal noise is accounted for in the calculation of the digital output value as described above. As an alternative, comparator K1 in the circuits of FIG. 1 and FIG. 2 can be replaced with a comparator of known hysteresis, and signal sub permitted to extend for more than one period of sampling clock MCLK, in which case the assertion of signal sub (and the consequent reference thermal noise) is accounted for at each MCLK period for which signal sub is asserted.

Figure 4:
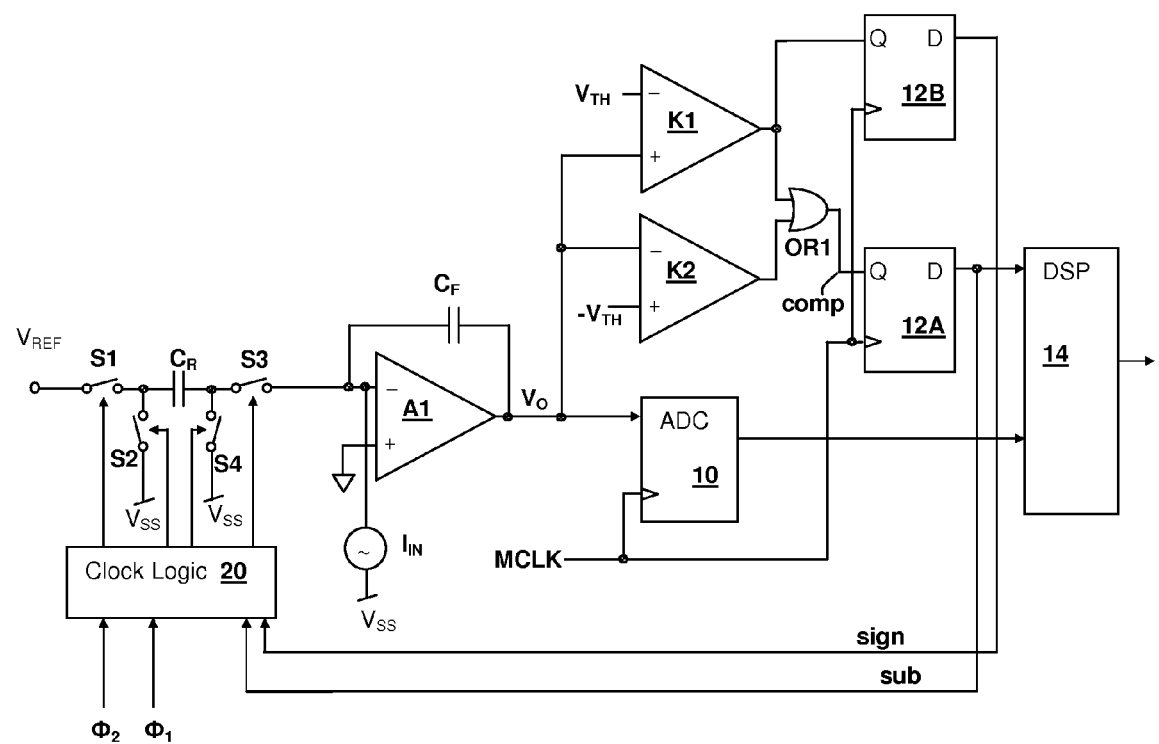
FIG. 4 is a block diagram depicting an ADC in accordance with yet another embodiment of the present invention.

Referring now to FIG. 4, an ADC circuit in accordance with yet another embodiment of the present invention is shown. The ADC circuit of FIG. 4 is similar to the ADC circuit of FIG. 1, and therefore only differences between them will be described below. The ADC of FIG. 4 receives a bipolar input current $I_{IN}$ (illustrated as an AC current) instead of a uni-polar signal, and therefore the output of the integrator formed by amplifier A1 and feedback capacitor $C_F$ can assume both positive and negative values. Comparators K1 and K2 detect whether or not the output voltage of amplifier A1 has exceeded positive threshold voltage $V_{TH}$ or has fallen below a negative threshold voltage $-V_{TH}$, respectively, and the outputs of comparators K1 and K2 are combined by a logical-OR gate OR to generate detector output signal comp. Detector output signal comp is sampled by a latch 12A to generate the sub signal, which is used to activate application of the reference to the input of the integrator formed by amplifier A1 and feedback capacitor $C_F$. The output of comparator K1 is sampled by a latch 12B, to generate a signal sign, which indicates the polarity of the output of the integrator formed by amplifier A1 and feedback capacitor $C_F$. Signal sub and comp are provided to a clock logic 20, which applies clock signals to switches S1-S4 when signal sub is asserted, according to a switching sequence dictated by signal sub, so that the proper polarity of the reference is applied to the integrator, according to Table I below, in which "O" indicates open and "C" indicates closed for each of switches S1-S4 in each active clock phase Φ1 and Φ2.

TABLE I

| sub | sign | Φ1 | Φ2 | S1 | S2 | S3 | S4 |
|-----|------|----|----|----|----|----|----|
| 0 | 0 | 0 | 1 | O | O | O | O |
| 0 | 0 | 1 | 0 | O | O | O | O |
| 0 | 1 | 0 | 1 | O | O | O | O |
| 0 | 1 | 1 | 0 | O | O | O | O |
| 1 | 0 | 0 | 1 | C | O | C | O |
| 1 | 0 | 1 | 0 | O | C | O | C |
| 1 | 1 | 0 | 1 | C | O | O | C |
| 1 | 1 | 1 | 0 | O | C | C | O |

Signal sign is also provided to DSP 14, so that the proper polarity of reference application can be used in the computation of input current $I_{IN}$, according to:

$$I[n]=\text{sgn}(\text{sign})*\text{sub}*V_{REF}*C_R/C_F+M[n]-M[n-1],$$

where sgn(sign)=−1 when sign=0 and sgn(sign)=1 when sign=1.

While the invention has been particularly shown and described with reference to the preferred embodiments thereof, it will be understood by those skilled in the art that the foregoing and other changes in form and details may be made therein without departing from the spirit and scope of the invention.

What is claimed:

1. An analog-to-digital converter circuit, comprising:
   an integrator for receiving an input signal to be converted to a digital representation of the input signal;
   a reference switched-capacitor circuit for applying a reference charge to an input of the integrator to reduce a magnitude of a voltage of an output of the integrator, wherein the reference switched capacitor circuit is operated according to a switching clock;
   a comparison circuit for determining when the magnitude of the voltage of the output of the integrator exceeds a threshold voltage; and
   a control circuit for controlling switching of the reference switched-capacitor circuit in response to an output of the comparison circuit, wherein the switching clock is enabled in response to the magnitude of the voltage of the output of the integrator exceeding the threshold voltage.

2. The analog-to-digital converter circuit of claim 1, wherein the input signal is an input current coupled directly to an input summing node of the integrator.

3. The analog-to-digital converter circuit of claim 1, wherein the input signal is an input voltage, and further comprising an input switched-capacitor circuit for applying the input voltage to the integrator.

4. The analog-to-digital converter circuit of claim 1, further comprising a latch for latching the output of the comparison circuit according to a sampling clock, and wherein the control circuit enables switching of the reference switched-capacitor circuit in conformity with an output of the latch.

5. The analog-to-digital converter of claim 4, further comprising:
   an internal analog-to-digital converter having an input coupled to the output of the integrator for periodically generating output values according to the sampling clock; and
   a digital circuit for determining differences between the output values and to obtain the digital representation of the input signal in conformity with at least one of the differences and the state of the output of the latch.

6. The analog-to-digital converter of claim 1, further comprising:
an internal analog-to-digital converter having an input coupled to the output of the integrator for periodically generating output values; and
a digital circuit for determining differences between the output values to obtain the digital representation of the input signal.

7. The analog-to-digital converter of claim 6, wherein the digital circuit is a processor responsive to program instructions for computing the differences.

8. A method of converting an analog signal level to a digital output value, comprising:
continually integrating the analog signal level with an analog integrator;
intermittently applying a reference charge to an input of the analog integrator to reduce a magnitude of a voltage of an output of the integrator according to a switching clock and a control indication that controls whether or not the switching clock applies the reference charge in a given period of the switching clock;
determining when the magnitude of the voltage of the output of the integrator exceeds a threshold voltage; and
generating the control indication in response to a result of the determining, wherein the switching clock applies the reference charge to the analog integrator in response to a result of the determining.

9. The method of claim 8, wherein the input signal is an input current, and further comprising providing the input current directly to an input summing node of the analog integrator.

10. The method of claim 8, wherein the input signal is an input voltage, and further comprising continuously applying the input voltage to the integrator through an input switched capacitor circuit according to the switching clock.

11. The method of claim 8, further comprising latching a result of the determining according to a sampling clock, and wherein the generating generates the control signal from a result of the latching.

12. The method of claim 11, further comprising:
periodically generating output values according to the sampling clock from the output of the integrator using an analog-to-digital converter; and
determining differences between the output values to obtain the digital representation of the input signal in conformity with at least one of the differences and a state of the result of the latching.

13. The method of claim 8, further comprising:
periodically generating output values according to the sampling clock from the output of the integrator using an analog-to-digital converter; and
determining differences between the output values to obtain the digital representation of the input signal in conformity with at least one of the differences.

14. The method of claim 13, wherein the determining is performed by computing the digital representation using a processor responsive to program instructions.

15. An analog-to-digital converter circuit, comprising:
an integrator for receiving an input signal to be converted to a digital representation of the input signal according to a sampling clock;
a reference circuit for restoring the integrator toward a zero value output in order that the integrator remain in linear operation; and
a control circuit for controlling operation of the reference circuit switching of the reference switched-capacitor circuit such that the reference circuit is not operated at each sampling clock but intermittently according to an indication of a magnitude of the output of the integrator.

16. The analog-to-digital converter of claim 15, wherein the control circuit comprises:
a comparison circuit for comparing an output voltage of the integrator to a threshold voltage; and
a latch for latching the output of the comparison circuit according to a sampling clock, and wherein the control circuit enables the reference circuit in conformity with an output of the latch.

17. The analog-to-digital converter of claim 16, further comprising:
an internal analog-to-digital converter having an input coupled to the output of the integrator for periodically generating output values according to the sampling clock; and
a digital circuit for determining differences between the output values and to obtain the digital representation of the input signal in conformity with at least one of the differences and the state of the output of the latch.

18. A method of converting an analog signal level to digital output values, comprising:
continually integrating the analog signal level with an analog integrator;
restoring the analog integrator toward a zero value output in order that the analog integrator remain in linear operation; and
determining when the magnitude of an output of the analog integrator exceeds a threshold voltage, wherein the restoring is performed only in response to the determining that the output of the analog integrator has exceeded the threshold voltage.

19. The method of claim 18, further comprising latching a result of the determining according to a sampling clock, and wherein the restoring is performed in conformity with a result of the latching.

20. The method of claim 19, further comprising:
periodically generating the digital output values according to the sampling clock from the output of the integrator using an analog-to-digital converter; and
determining differences between the output values to obtain the digital representation of the input signal in conformity with at least one of the differences and a state of the result of the latching.

* * * * *